(12) United States Patent
Lenert et al.

(10) Patent No.: US 9,929,690 B2
(45) Date of Patent: Mar. 27, 2018

(54) SPECTRALLY-ENGINEERED SOLAR THERMAL PHOTOVOLTAIC DEVICES

(71) Applicant: Massachusetts Institute of Technology, Cambridge, MA (US)

(72) Inventors: Andrej Lenert, Ann Arbor, MI (US); David Bierman, Cambridge, MA (US); Walker Chan, Princeton, NJ (US); Ivan Celanovic, Cambridge, MA (US); Marin Soljacic, Belmont, MA (US); Evelyn N. Wang, Cambridge, MA (US); Young Suk Nam, Yongin (KR); Kenneth McEnaney, Cornish, NH (US); Daniel Kraemer, Providence, RI (US); Gang Chen, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 121 days.

(21) Appl. No.: 14/529,578

(22) Filed: Oct. 31, 2014

(65) Prior Publication Data

US 2016/0164451 A1 Jun. 9, 2016

Related U.S. Application Data

(60) Provisional application No. 61/898,083, filed on Oct. 31, 2013.

(51) Int. Cl.
*H02S 10/30* (2014.01)
*H01L 31/0216* (2014.01)

(52) U.S. Cl.
CPC ........ *H02S 10/30* (2014.12); *H01L 31/02164* (2013.01)

(58) Field of Classification Search
CPC ........... H01L 31/0261; H01L 31/02164; H01L 31/02165; H01L 31/0264; H02S 10/30
See application file for complete search history.

(56) References Cited

U.S. PATENT DOCUMENTS

| | | | |
|---|---|---|---|
| 4,746,370 A | 5/1988 | Woolf | |
| 2004/0114114 A1* | 6/2004 | Yano | G02B 5/283 353/84 |

(Continued)

OTHER PUBLICATIONS

Datas et al, "Global optimization of solar thermophotovoltaic systems", Apr. 4, 2012, Progress in Photovoltaics, vol. 21, Issue 5 pp. 1040-1055.*

(Continued)

*Primary Examiner* — Bethany L Martin
(74) *Attorney, Agent, or Firm* — Sunstein Kann Murphy & Timbers LLP

(57) ABSTRACT

A solar thermal photovoltaic device, and method of forming same, includes a solar absorber and a spectrally selective emitter formed on either side of a thermally conductive substrate. The solar absorber is configured to absorb incident solar radiation. The solar absorber and the spectrally selective emitter are configured with an optimized emitter-to-absorber area ratio. The solar thermal photovoltaic device also includes a photovoltaic cell in thermal communication with the spectrally selective emitter. The spectrally selective emitter is configured to permit high emittance for energies above a bandgap of the photovoltaic cell and configured to permit low emittance for energies below the bandgap.

20 Claims, 5 Drawing Sheets

(56) References Cited

U.S. PATENT DOCUMENTS

| | | | | |
|---|---|---|---|---|
| 2009/0126783 | A1* | 5/2009 | Lin | B82Y 20/00 |
| | | | | 136/252 |
| 2011/0203663 | A1 | 8/2011 | Prather et al. | |
| 2011/0279141 | A1 | 11/2011 | Wang et al. | |
| 2011/0284059 | A1* | 11/2011 | Celanovic | H02S 10/30 |
| | | | | 136/253 |
| 2012/0312360 | A1 | 12/2012 | Shvets et al. | |
| 2013/0240008 | A1* | 9/2013 | Baker | H02S 20/00 |
| | | | | 136/244 |

OTHER PUBLICATIONS

International Searching Authority, International Search Report—International Application No. PCT/US14/63375, dated Jul. 20, 2015, together with the Written Opinion of the International Searching Authority, 16 pages.

* cited by examiner

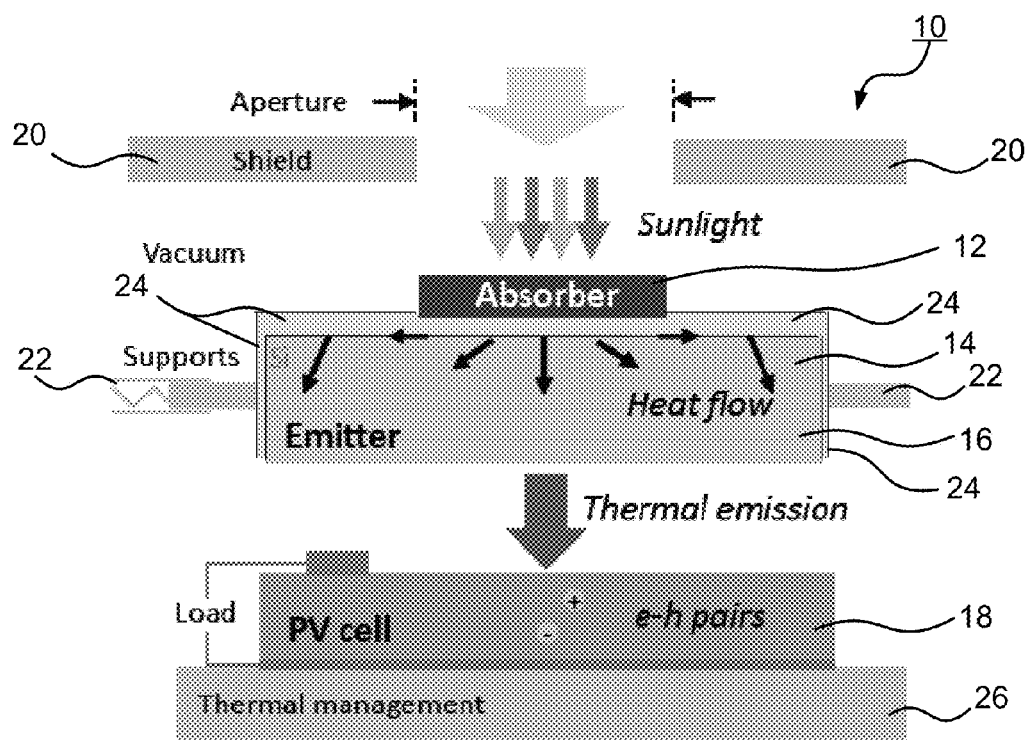
FIG. 1
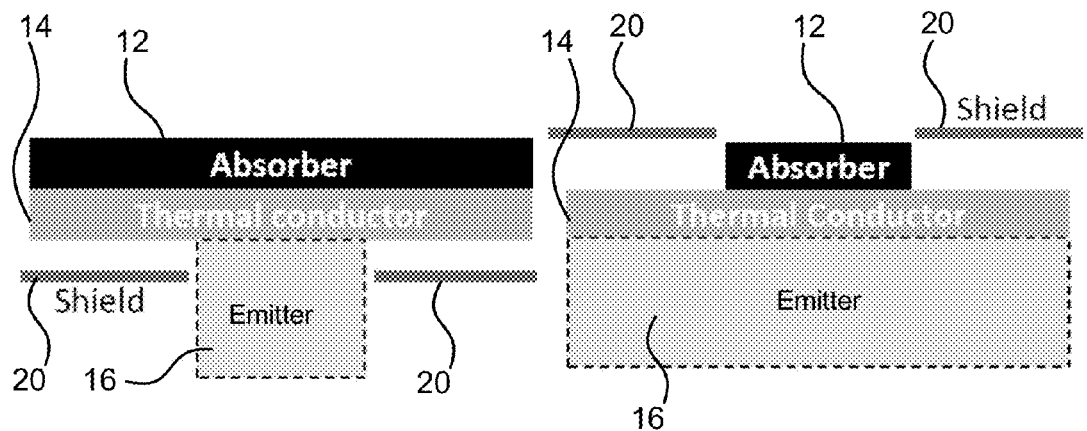
FIG. 2A
FIG. 2B

SPECTRALLY-ENGINEERED SOLAR THERMAL PHOTOVOLTAIC DEVICES

CROSS-REFERENCE TO RELATED APPLICATIONS

This patent application claims the benefit of U.S. Provisional Patent Application No. 61/898,083 filed Oct. 31, 2013, the disclosure of which is incorporated by reference herein in its entirety.

STATEMENT REGARDING FEDERALLY SPONSORED RESEARCH OR DEVELOPMENT

This invention was made with Government support under Contract Nos. DE-SC0001299 and DE-FG02-09ER46577 awarded by the Department of Energy and under Contract No. W911NF-13-D-0001 awarded by the Army Research Office. The Government has certain rights in the invention.

TECHNICAL FIELD

The present invention relates to photovoltaic devices, and more specifically to solar thermal photovoltaic devices.

BACKGROUND ART

To generate power from sunlight, the most common approaches are either photovoltaic (PV), where sunlight directly excites electron-hole pairs, or solar thermal, where sunlight drives a mechanical heat engine. However, since power generation using PVs is intermittent and typically only utilizes a portion of the solar spectrum efficiently, and the solar thermal approach is best suited for utility-scale power plants, there is an imminent need for hybrid technologies. Solar thermal photovoltaic technologies, that convert solar radiation to heat and then to electricity, promise to leverage the benefits of both approaches. However, the need for high operating temperatures of the devices makes spectral control and the efficient collection of sunlight particularly challenging, limiting prior experimental demonstrations to solar-to-electrical conversion efficiencies around 1% or below.

SUMMARY OF EMBODIMENTS

In accordance with one embodiment of the invention, a solar thermal photovoltaic device includes a solar absorber and a spectrally selective emitter formed on either side of a thermally conductive substrate. The solar absorber is configured to absorb incident solar radiation. The solar absorber and the spectrally selective emitter are configured with an optimized emitter-to-absorber area ratio for a given solar radiation. The solar thermal photovoltaic device also includes a photovoltaic cell in thermal communication with the spectrally selective emitter. The spectrally selective emitter is configured to permit high emittance for energies above a bandgap of the photovoltaic cell and configured to permit low emittance for energies below the bandgap. Methods of forming the solar thermal photovoltaic device are also provided.

In some embodiments, the emitter-to-absorber area ratio may range from about 1 to about 20. The solar absorber may include carbon nanotubes. The carbon nanotubes may be vertically-aligned, multiwall carbon nanotubes. The carbon nanotubes may have an outer diameter ranging from about 10 nm to about 15 nm and length ranging from about 80 μm to about 100 μm. The spectrally selective emitter may include a one-dimensional photonic crystal formed with alternating layers of Si and $SiO_2$. The solar thermal photovoltaic device may further include a coating formed on the thermally conductive substrate adjacent to the solar absorber. The coating includes a material configured to withstand elevated operating temperatures of the solar thermal photovoltaic device and configured to reduce parasitic radiation from leaving the solar thermal photovoltaic device, such as tungsten. The solar thermal photovoltaic device may further include a shield formed adjacent to the solar absorber or adjacent to the spectrally selective emitter. The shield is configured to recycle parasitic radiation back to the solar thermal photovoltaic device, e.g., a shield coated with silver, aluminum or other reflective metal. The spectrally selective emitter may be configured to operate at an elevated temperature ranging from about 800 K to about 1500 K. The solar thermal photovoltaic device may further include a spring-loaded support coupled to the spectrally selective emitter and/or the thermally conductive substrate. The support is configured to minimize the heat conducted away and lost from the thermally conductive substrate. The support may be configured as a hollow tube made out of a high temperature low thermal conductivity metal or ceramic, or combination of the two.

BRIEF DESCRIPTION OF THE DRAWINGS

The foregoing features of the invention will be more readily understood by reference to the following detailed description, taken with reference to the accompanying drawings, in which:

FIG. 1 schematically shows a solar thermal photovoltaic device according to embodiments of the present invention;

FIGS. 2A and 2B schematically show an absorber-emitter module with a reflecting shield in two different positions according to embodiments of the present invention;

DESCRIPTION OF ILLUSTRATIVE EMBODIMENTS

Figure 3A:
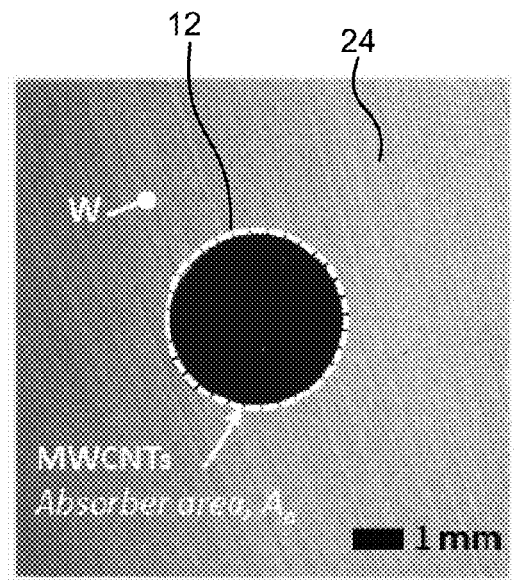
FIG. 3A is a photomicrograph showing a plan view of an absorber formed on a substrate.

Hybrid technologies that convert solar radiation to heat and then to electricity via solid-state thermal power generators leverage the benefits of both PV and solar thermal approaches: high-efficiency—by harnessing the entire solar spectrum; scalability, compactness—because of their solid-state nature; and dispatchablility—through potential thermal/chemical energy storage. For any individual or combination of solid-state thermal power generation technologies (e.g., thermophotovoltaic, thermoelectric, thermionic, etc.) using sunlight as the heat source, a significant temperature difference across the thermal power generator must be used for efficient power conversion. In thermophotovoltaic energy conversion, for example, in order to excite enough thermal modes for substantial emission above the PV bandgap, the emitter temperature ideally should be high enough such that the peak of Planck's blackbody distribution approaches the PV bandgap:

$$T_e^{opt} \approx 2336 \text{ K/eV} \cdot E_g \quad (1)$$

The high temperature operation of the emitter poses two key challenges to efficient solar thermal photovoltaic power conversion, however, collecting sunlight to efficiently reach $T_e^{opt}$, and maintaining spectral selectivity at elevated temperatures.

Embodiments of the present invention solve these issues by providing a solar thermal photovoltaic device that includes a spectrally-engineered absorbing surface to efficiently absorb concentrated sunlight and deliver it to a spectrally selective emitter. The hot absorber-emitter module converts sunlight to thermal emission tuned to energies directly above the PV bandgap. The planar area ratio between the absorber and the spectrally selective emitter are selected and optimized for a specific solar irradiance or optical concentration to achieve significantly improved thermal efficiency (i.e., the efficiency of converting and delivering sunlight as heat to the spectrally selective emitter). Embodiments of the present invention achieve this area ratio (AR) optimization by patterning the active area of the absorber with respect to the spectrally selective emitter, or vice versa. By simultaneously tuning the spectral properties and the energy balance of the absorber-emitter using nanophotonic surfaces, experimental efficiencies are achieved four times greater than those previously reported. In a preferred embodiment, a compact, planar solar thermal photovoltaic device includes a multi-wall carbon nanotube absorber and a one-dimensional $Si/SiO_2$ photonic crystal emitter with an optimized absorber-emitter area. The optimized absorber-emitter module on a 1×1 cm thermal photovoltaic device shows thermal efficiencies exceeding 50%, and predict thermal efficiencies approaching 80% for a scaled-up 10×10 cm thermal photovoltaic device with moderate optical concentrations (<1000×), facilitating solar-to-electrical efficiencies exceeding 20%. Details of illustrative embodiments are discussed below.

FIG. 1 schematically shows a solar thermal photovoltaic device 10 according to embodiments of the present invention. The device 10 includes a solar absorber 12 formed on one side of a thermally conductive substrate 14, and a spectrally selective emitter 16 formed on the other side of the substrate 14 in order to achieve high conversion efficiencies in a compact planar layout without resorting to more complex configurations. The solar absorber 12 is configured to absorb incident solar radiation and the spectral properties of the absorber 12 are tailored through surface micro/nano fabrication.

The solar absorber 12 and the spectrally selective emitter 16 are configured with an optimized emitter-to-absorber area ratio to achieve optimal performance. For example, the emitter-to-absorber area ratio ($AR=A_e/A_a$) may be varied from about 1 to about 20 to achieve optimal performance for a given solar irradiance. With increasing AR, enough heat is supplied for the absorber-emitter to reach $T_e^{opt}$ by increasing the level of irradiance and leveraging the high absorptance of the absorber 12. Thermal resistance between the absorber 12 and the spectrally selective emitter 16 is minimized by integrating the absorber 12 and spectrally selective emitter 16 on the same conductive substrate 14 (e.g., silicon substrate) such that heat is effectively delivered to the spectrally selective emitter 16 via thermal spreading. Since the absorber 12 area is reduced with respect to the planar area of the substrate, the area for re-emissive losses from the nearly-blackbody solar absorber 12 surface is decreased, thus boosting thermal efficiency.

The solar thermal photovoltaic device 10 also includes a photovoltaic cell 18 in thermal communication with the spectrally selective emitter 16. Since no portion of incident sunlight reaches the PV cell 18 directly, the performance of solar thermal photovoltaic devices rely on the efficiency of several intermediate energy conversion steps. Optically concentrated sunlight is converted into heat in the absorber 12; the absorber temperature rises; heat conducts to the emitter 16; the hot emitter 16 thermally radiates towards the PV cell 18, where radiation is ultimately converted into excited charge carriers and electricity. The overall efficiency ($\eta_{stpv}$) can be expressed as a product of the optical efficiency of concentrating sunlight ($\eta_o$) the thermal efficiency of converting and delivering sunlight as heat to the emitter ($\eta_t$), and the efficiency of generating electrical power from the thermal emission ($\eta_{tpv}$).

$$\eta_{stpv}=\eta_o\eta_t\eta_{tpv} \quad (2)$$

The thermal PV efficiency ($\eta_{tpv}$) hinges on the spectral properties and the temperature of the emitter 16. Therefore, the spectrally selective emitter 16 should be configured to have high emittance for energies above the bandgap ($E_g$) of the PV cell 18 and low emittance for energies below the bandgap.

To reduce parasitic losses, the sides of the substrate 14 and/or the inactive area around the absorber 12 (e.g., the difference between the absorber 12 area and the spectrally selective emitter 16 area) may be coated with a relatively low-emissivity, high-temperature material 24, such as a metal (e.g., tungsten). In addition, a high-reflectivity reflecting shield 20 may be used (e.g., a shield coated with silver) to recycle this parasitic radiation back to the device 10. The reflecting shield 20 may be disposed above the absorber 12 (from the perspective of the incident solar irradiation), such as shown in FIGS. 1 and 2B, or disposed adjacent to the spectrally selective emitter 16, such as shown in FIG. 2A. The absorber-emitter module 12, 14, 16 may be mechanically secured to a housing wall (not shown) using a spring-loaded needle-support 22 layout which minimizes parasitic conduction losses. The support 22 is preferably coupled to the thermally conductive substrate 14, but it may be coupled to the spectrally selective emitter 16 or absorber 12, instead of, or in addition to, the thermally conductive substrate 14. Alignment and gap control between the reflecting shield 20, the absorber-emitter module 12, 14, 16, and the PV cell 18 may be achieved using manual linear stages or a fixed spacing between the supports and the PV cell 18 and shield 20. The solar thermal photovoltaic device 10 may also include a thermal management system 26, such as a chilled water cooling system, in thermal communication with the PV cell 18.

Figure 3B:
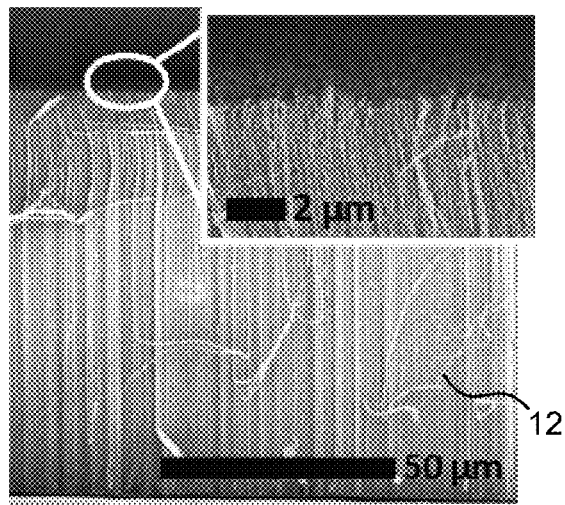
FIG. 3B is a scanning electron micrograph showing a cross-sectional view of an absorber made of carbon nanotubes according to embodiments of the present invention.

In a preferred embodiment, vertically-aligned, multi-wall carbon nanotubes may be used for the solar absorber 12 due to their nearly ideal absorptance, crucial for absorbing highly-concentrated irradiance at elevated AR. FIGS. 3A and 3B show a plan view and cross-sectional view, respectively, of an absorber 12 made of carbon nanotubes. FIG. 3A shows an absorber-side optical image of an AR=10 module showing spatially-defined multi-wall carbon nanotubes ($A_a$=0.1 cm$^2$) on a W-coated Si substrate (1×1 cm planar area, 550 µm thick). FIG. 3B shows an SEM cross-section of the multi-wall carbon nanotubes. The inset shows a magnified view of the multi-wall carbon nanotubes tips. The as-grown multi-wall carbon nanotubes may be about 10 nm to about 15 nm in outer diameter and about 80 µm to about 100 µm length with about a ~0.5 µm variation in height at the tips, although similar multi-wall carbon nanotubes geometries may also be used that have broad-spectrum absorptance exceeding 0.99.

Figure 4A:
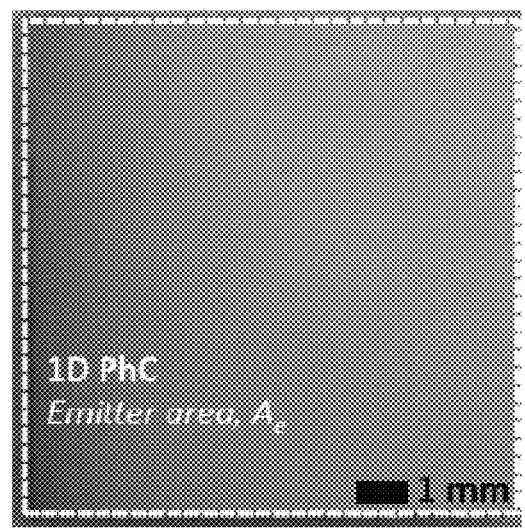
FIG. 4A is a photomicrograph showing a plan view of a spectrally selective emitter.
Figure 4B:
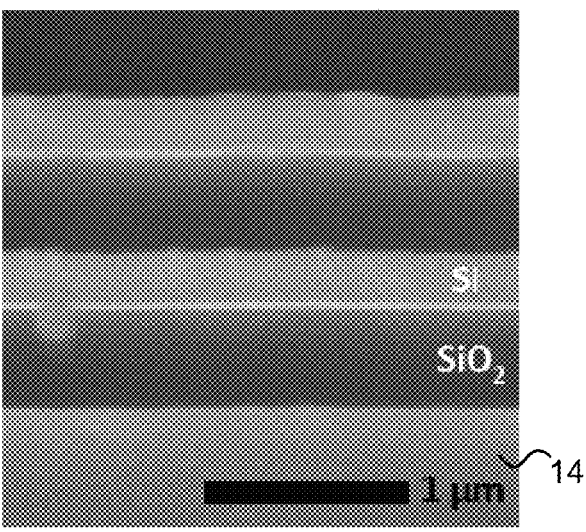
FIG. 4B is a scanning electron micrograph showing a cross-sectional view of a one-dimensional photonic crystal emitter made of alternating layers of Si and $SiO_2$ according to embodiments of the present invention.

In a preferred embodiment, one-dimensional Si/SiO$_2$ photonic crystals may be used for the spectrally selective emitter 16. FIGS. 4A and 4B show a plan view and cross-sectional view, respectively, of a spectrally selective emitter 16 made of alternating layers of Si and SiO$_2$. The multilayer Si/SiO$_2$ structure of the one-dimensional photonic crystals may be preferably composed of five alternating layers of Si and SiO$_2$, which improves the spectral matching between the emittance of the emitter 16 and the internal quantum efficiency (IQE) of the PV cell 18, such as a InGaAsSb low band-gap PV cell ($E_g$=0.55 eV). These materials have a high-temperature compatibility with a silicon substrate 14 and may be easily fabricated. The various layer thicknesses may be optimized via a constrained global optimization of the product of efficiency and power density, as known by one skilled in the art.

The absorber 12 and the emitter 16 may be prepared using conventional physical and chemical vapor deposition (e.g., PVD, CVD) processes. For example, a polycrystalline Si and SiO$_2$ structure of a one-dimensional photonic crystal emitter 16 may be deposited by low-pressure and plasma enhanced chemical vapor deposition, respectively. The wafer/substrate 14 may be annealed after each deposition. On the backside of the emitter substrate 14, an adhesion layer of Ti (e.g., about 10 nm) may be sputtered onto the substrate 14 followed by a layer of low-emissivity, high-temperature material 24, e.g., about a 200 nm W layer. Using a mask, a seed layer for carbon nanotube growth may be deposited onto the substrate 14 with electron-beam evaporation, e.g., a Fe seed layer. The carbon nanotubes may be grown using a high-temperature CVD process, e.g., in a H$_2$/He environment. For example, the substrate may be heated to about 720° C. from room temperature in about 10 min. and held at about 720° C. for about 5 min. to anneal the seed layer. Carbon nanotubes may be grown for about 10 min. at about 720° C. using an ethylene gas carbon source. All of the flowing gases may be preheated to about 625° C. Following the growth, the furnace may be rapidly cooled in a H$_2$/He environment.

EXAMPLES

Two experiments were conducted to gain more insight into the complex energy conversion in the devices 10 and compare it to theoretical predictions. The devices were composed of an aperture/radiation-shield, a multi-wall carbon nanotube absorber, a one-dimensional Si/SiO$_2$ photonic crystal emitter, a 0.55 eV bandgap PV cell (InGaAsSb), and a chilled water cooling system. The experiments on each absorber-emitter module were conducted by varying the flux of simulated solar radiation (Hs) through an aperture (10-75 W/cm$^2$). I-V and temperature measurements were obtained at steady operating conditions of the solar thermal photovoltaic device. Vacuum gaps of 400 µm and 300 µm separated the shield 20 from the absorber 12 and the emitter 16 from the PV cell 18, respectively, such that the aperture/absorber and emitter/PV cell view factors exceeded 0.90. The PV temperature was maintained near 293 K using the chilled water loop. The entire experimental device was maintained in vacuum (<0.5 Pa) to suppress convective and conductive heat transfer through the environment. A Xe-arc light source was used to supply the input power simulating the solar spectrum. By varying the distance between the light source and the device, a range of irradiances, $H_s$, from 10 to 75 Wcm$^{-2}$ were studied. $H_s$ is defined as the input solar power through the aperture normalized by the aperture area, or equivalently, the absorber 12 area. I-V characteristics of the PV diode were investigated, including photocurrent and maximum power generated, as a function of the absorber-emitter temperature ($T_{ae}$) in the thermal PV device experiment and the irradiance ($H_s$) in the solar thermal photovoltaic device experiment. The temperature measurement in the thermal PV characterization was achieved by bonding a fine gage thermocouple directly to the absorber-side of the substrate 14.

Example 1

Figure 5:
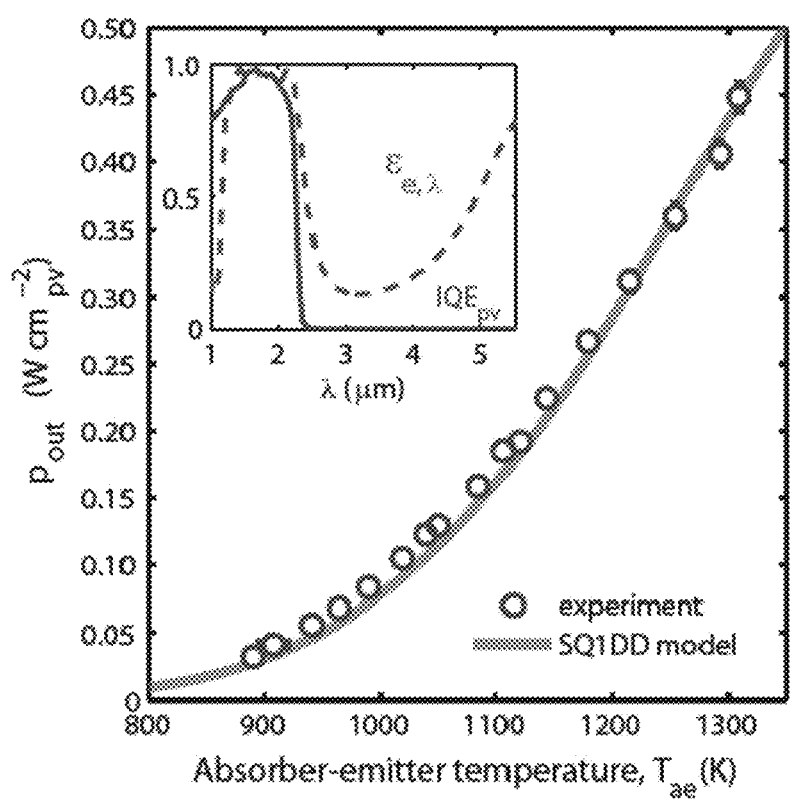
FIG. 5 is a graph showing electrical output power density as a function of emitter temperature for a thermal photovoltaic device formed according to embodiments of the present invention.

As shown in FIG. 5, the output power of the PV cell displays an exponential behavior as Planck's distribution shifts to higher energies with increasing emitter temperature. These experimental results are supported by a spectral quasi-1D diffuse radiative network model (SQ1DD). The model assumes isothermal operation of the absorber-emitter module (i.e., $T_a=T_e=T_{ae}$) and accounts for the experimentally measured spectral properties of the components (e.g., $\epsilon_\lambda$, IQE) and the geometrical configuration of the planar solar thermal photovoltaic device. The results of the thermal PV experiment serve as a validation of the model and provide an indirect method for determining the temperature of the absorber-emitter module from the measured output power. This approach was used in the solar thermal photovoltaic device characterization since a direct in-situ measurement of the absorber-emitter module temperature with minimal impact on the efficiency was challenging.

Example 2

Figure 6A:
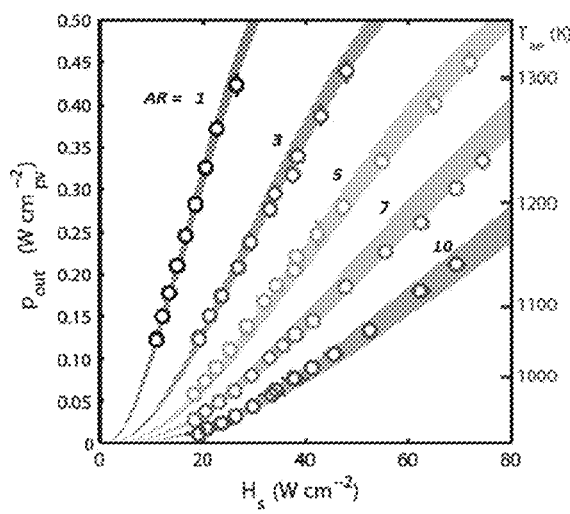
FIGS. 6A-6D are graphs showing various properties of a solar thermal photovoltaic device formed according to embodiments of the present invention.

The full energy conversion processes were investigated in the solar thermal photovoltaic device with increasing emitter-to-absorber area ratios. FIG. 6A shows the electrical output power of the solar thermal photovoltaic devices as a function of irradiance ($H_s$) and the absorber-emitter temperature (determined using the relation between $p_{out}$ and $T_{ae}$ shown in FIG. 5) for various emitter-to-absorber area ratios. In FIGS. 6A-D, the markers shown are experimental points (errors bars represent 95% confidence interval), and the solid bands represent the SQ1DD model. The upper and lower estimates of the SQ1DD model associated with treating $H_s$ as collimated or diffuse, respectively, bound the data within the experimental uncertainty. In FIG. 6A, the effect of increasing AR is manifested in shifting the operating points to a regime of increased irradiance ($H_s$) relative to the thermal re-emission loss ($\sigma T_{ae}^4$). If the absorber solar collection efficiency is considered (a major component of the thermal efficiency) for a blackbody surface:

$$\eta_a^{BB} = 1 - \frac{\sigma T_{ae}^4}{H_s} \qquad (3)$$

a decrease in the $\sigma T_{ae}^4/H_s$ ratio results in higher absorber efficiency. For the nearly-blackbody absorber surfaces, this regime graphically corresponds to the lower right corner of FIG. 6A. Using equation (3), the absorber efficiency for AR=10 is estimated to be above 75%.

Figure 6B:
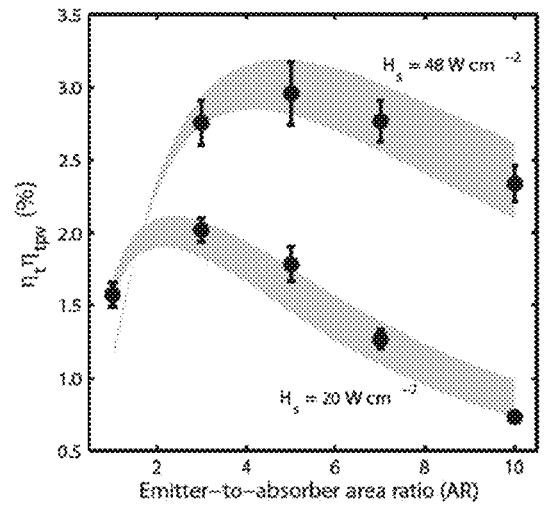

Nevertheless, absorber efficiency is only a component of the overall solar thermal photovoltaic device efficiency. Indeed, the efficiency of converting concentrated sunlight into electrical power ($\eta_t\eta_{tpv}$) does not monotonically increase with increasing AR for a fixed irradiance ($H_s$). As shown in FIG. 6B, an optimal AR exists. FIG. 6B is a graph showing conversion efficiency with increasing AR for two fixed irradiances, $H_s$=20 and 48 W/cm². To understand why this optimal AR arises, the competing effects of the thermal efficiency and the thermal PV efficiency are considered. The thermal efficiency is significantly enhanced as AR is increased due to a rise in absorber efficiency (as explained above). In contrast, with increasing AR for a fixed $H_s$, the operating temperature of the absorber-emitter module decreases since the ratio of the absorbed solar power ($\sim A_a H_s$) relative to the thermal emission ($\sim A_e \sigma T_{ae}^4$) decreases; ultimately leading to a decrease in thermal PV efficiency as the temperature drops significantly below the $T_e^{opt}$. These two competing effects lead to an optimal AR for a fixed irradiance, or equivalently, for a fixed optical concentration. In general, the optimum AR increases with optical concentration, as shown in FIG. 6B, where the optimum shifts from approximately AR=2 to AR=5 as $H_s$ is increased from 20 to 48 W/cm².

Figure 6C:
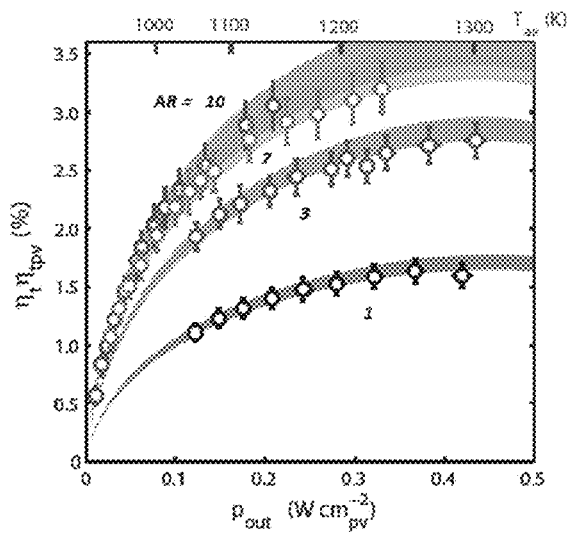
Figure 6D:
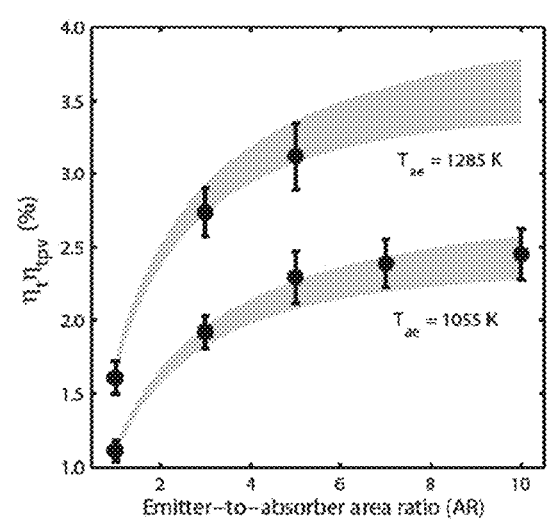

Using the relation between $p_{out}$ and $T_{ae}$ (FIG. 5), the system performance as a function of absorber-emitter temperature was investigated. FIG. 6C is a graph showing conversion efficiency as a function of the electrical output power density or absorber-emitter temperature for various emitter-to-absorber area ratios. FIG. 6C shows that the efficiency initially increases sharply with emitter temperature (below 1200 K) as thermal modes with energies above $E_g$ are increasingly excited. As the temperature approaches $T_e^{opt}$, the efficiency plateaus as increasing useful emission (i.e., radiation at E>$E_g$) is balanced by increasing re-emission losses and PV inefficiencies associated with high photocurrents. Increasing AR for a given absorber-emitter module temperature results in increased conversion efficiency, as shown in FIG. 6D. FIG. 6D is a graph showing conversion efficiency as a function of emitter-to-absorber area ratio for two absorber-emitter temperatures. Since the thermal PV efficiency is fixed by the emitter temperature in the experiments, the relative increase in conversion efficiency ($\eta_t\eta_{tpv}$) is completely attributed to the increase in thermal efficiency. At $T_e^{opt}$ (1285 K), a two-fold increase was experimentally demonstrated in thermal efficiency from AR=1 to AR=5.

Overall, the highest conversion efficiency ($\eta_t\eta_{tpv}$) measured was 3.2±0.22% using an AR=7 device which is 3-4 times greater than what has been previously reported. This efficiency was achieved using a compact solar thermal photovoltaic device design formed according to embodiments of the present invention at substantially lower levels of optical concentration (~750×), compared to previous solar thermal photovoltaic devices, enabling higher optical efficiencies.

Figure 7:
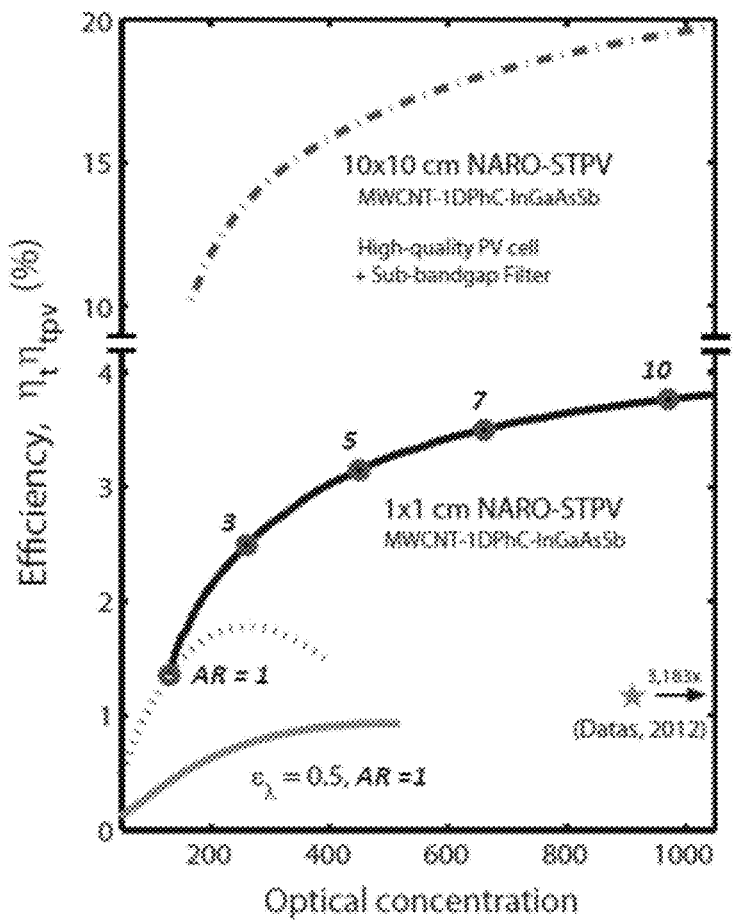
FIG. 7 is a graph showing conversion efficiency as a function of optical concentration ratio for a solar thermal photovoltaic device formed according to embodiments of the present invention.

FIG. 7 is a graph showing conversion efficiency as a function of optical concentration ratio for a solar thermal photovoltaic device formed according to embodiments of the present invention. As shown in FIG. 7, significant enhancements in efficiency relative to a gray body absorber-emitter ($\epsilon$=0.5) in the present planar layout were achieved through the use of: (i) one-dimensional Si/SiO₂ photonic crystals for improved spectral performance of the emitter and vertically aligned multi-walled carbon nanotubes for nearly ideal solar absorptance (a ~2× contribution to the improvement in $\eta_t\eta_{tpv}$) and (ii) optimization of the active emitter-to-absorber AR (an additional ~2× improvement). The concept of optimizing AR at a fixed optical concentration with a spectrally-engineered absorber-emitter, experimentally demonstrated with embodiments of the present invention, can be easily implemented in other solar thermal photovoltaic device designs to increase overall efficiency.

Through improved design and packaging, solar thermal photovoltaic devices may achieve solar conversion efficiencies exceeding 20% in the near term. From the SQ1DD model, the highest efficiency operating point corresponds to a temperature of 1235 K with 54% thermal efficiency and 5.8% TPV efficiency. The thermal efficiency should improve with increasing size as long as care is taken to avoid significant thermal spreading resistance. As the device scales in planar area from 1 to 100 cm² (labeled 10×10 cm in FIG. 7), the fraction of parasitic losses to the inactive area and mechanical supports was calculated to decrease to 20% of the useful emission at 1285 K, instead of the 91% in the current design. This should improve the thermal efficiency to approximately 75%. Furthermore, one important aspect limiting the conversion efficiency is the performance of the PV cell used in the examples, which had a fill factor of 0.48, a relatively low open-circuit voltage ($V_{oc}$=0.57$E_g$), and an 83% active area. Using an improved, yet realistic, 0.55 eV InGaAsSb cell (0.74 fill factor, $V_{oc}$=0.70 $E_g$, 90% active area) with a sub-bandgap photon reflecting filter on the PV surface, the solar thermal photovoltaic device efficiency should approach 20% at moderate optical concentrations (see FIG. 5) which is comparable to state-of-the-art Si PV.

Figure 8:
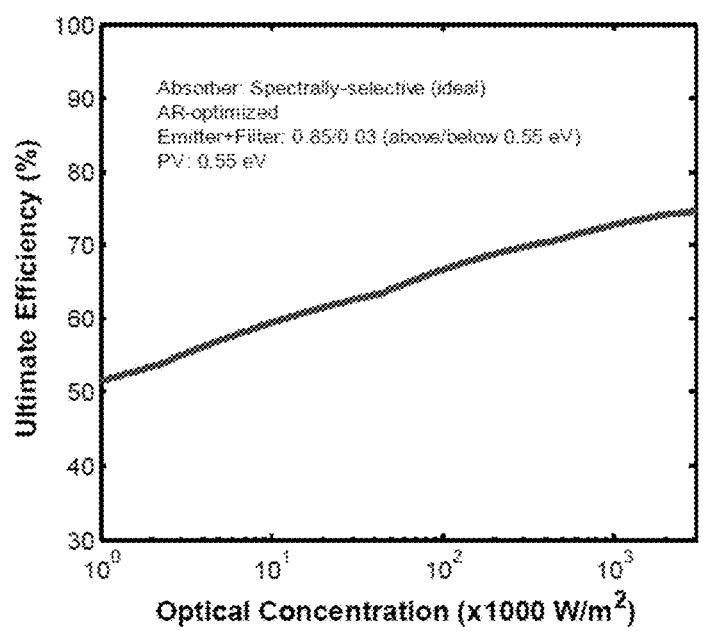
FIG. 8 is a graph showing ultimate efficiency as a function of optical concentration for a solar thermal photovoltaic device formed according to embodiments of the present invention.

FIG. 8 is a graph showing ultimate efficiency as a function of optical concentration for a solar thermal photovoltaic device formed according to embodiments of the present invention. As shown in FIG. 8, the emitter/filter has an emmitance of 0.85 above the bandgap energy, and 0.15 below the bandgap energy (for a PV cell with 0.55 eV bandgap).

Embodiments of the present invention provide a highly efficient design since the device harnesses the entire solar spectrum efficiently, including high-energy and infrared photons, while single-junction PVs only utilize a portion of the solar spectrum efficiently. In addition, embodiments may be able to provide electricity on-demand through relatively inexpensive thermal energy storage. In contrast, power generation using PVs is intermittent while the cost of electricity storage is high.

Near-term integration of surfaces with improved spectral performance, enabled by the present innovative solar thermal photovoltaic device design, should allow solar thermal photovoltaic devices formed according to embodiments of the present invention to achieve efficiencies exceeding 40% and surpass the operational limitations of single-junction PVs. These promising efficiency numbers, along with the potential to incorporate thermal/chemical storage, suggest the viability of spectrally-engineered solar thermal photovoltaic devices formed according to embodiments of the present invention for next-generation, efficient, scalable and dispatchable solar energy conversion. Therefore, embodiments demonstrate the design of a solar thermal photovoltaic device and suggest the viability of high performance solar thermal photovoltaic devices as a next generation solar power generation approach.

Although the above discussion discloses various exemplary embodiments of the invention, it should be apparent that those skilled in the art may make various modifications that will achieve some of the advantages of the invention without departing from the true scope of the invention.

What is claimed is:

1. A solar thermal photovoltaic device comprising:
   a solar absorber formed on one side of a thermally conductive substrate in an active area, the solar absorber configured to absorb incident solar radiation;
   a spectrally selective emitter formed on another side of the thermally conductive substrate, the solar absorber and the spectrally selective emitter configured with an optimized emitter-to-absorber planar area ratio;
   a coating formed between the solar absorber and the thermally conductive substrate, the coating comprising a low emissivity material configured to reduce parasitic radiation from the solar thermal photovoltaic device in an inactive area around the solar absorber; and
   a photovoltaic cell in thermal communication with the spectrally selective emitter, the spectrally selective emitter configured to permit emittance for energies above a bandgap of the photovoltaic cell at a higher level than emittance for energies below the bandgap.

2. The solar thermal photovoltaic device of claim 1, wherein the solar absorber comprises carbon nanotubes.

3. The solar thermal photovoltaic device of claim 2, wherein the carbon nanotubes are vertically-aligned multiwall carbon nanotubes.

4. The solar thermal photovoltaic device of claim 2, wherein the carbon nanotubes have an outer diameter ranging from about 10 nm to about 15 nm and length ranging from about 80 μm to about 100 μm.

5. The solar thermal photovoltaic device of claim 1, wherein the spectrally selective emitter comprises a one-dimensional photonic crystal formed with alternating layers of Si and $SiO_2$.

6. The solar thermal photovoltaic device of claim 1, wherein the coating on the thermally conductive substrate is formed of tungsten.

7. The solar thermal photovoltaic device of claim 1, further comprising a shield formed adjacent to the solar absorber in the inactive area or adjacent to the spectrally selective emitter in the inactive area, the shield configured to recycle parasitic radiation back to the solar thermal photovoltaic device.

8. The solar thermal photovoltaic device of claim 1, wherein the spectrally selective emitter is configured to operate at a temperature ranging from about 800 K to about 1300 K.

9. The solar thermal photovoltaic device of claim 1, further comprising a spring-loaded support coupled to a sidewall of the spectrally selective emitter, the thermally conductive substrate, and/or the solar absorber.

10. A method of forming a solar thermal photovoltaic device, the method comprising:
    forming a solar absorber on one side of a thermally conductive substrate in an active area, the solar absorber configured to absorb incident solar radiation;
    forming a spectrally selective emitter on another side of the thermally conductive substrate, the solar absorber and the spectrally selective emitter configured with an optimized emitter-to-absorber planar area ratio;
    forming a coating between the solar absorber and the thermally conductive substrate, the coating comprising a low emissivity material configured to reduce parasitic radiation from the solar thermal photovoltaic device in an inactive area around the solar absorber; and
    providing a photovoltaic cell in thermal communication with the spectrally selective emitter, the spectrally selective emitter configured to permit emittance for energies above a bandgap of the photovoltaic cell at a higher level than emittance for energies below the bandgap.

11. The method of claim 10, wherein forming the solar absorber includes forming carbon nanotubes on the thermally conductive substrate.

12. The method of claim 11, wherein forming carbon nanotubes includes forming vertically-aligned multiwall carbon nanotubes on the thermally conductive substrate.

13. The method of claim 11, wherein the carbon nanotubes have an outer diameter ranging from about 10 nm to about 15 nm and length ranging from about 80 μm to about 100 μm.

14. The method of claim 10, wherein forming the spectrally selective emitter includes forming a one-dimensional photonic crystal with alternating layers of Si and $SiO_2$.

15. The method of claim 10, wherein the coating on the thermally conductive substrate is formed of tungsten.

16. The method of claim 10, further comprising:
    forming a shield adjacent to the solar absorber in the inactive area or adjacent to the spectrally selective emitter in the inactive area, the shield configured to recycle parasitic radiation back to the solar thermal photovoltaic device.

17. The method of claim 10, wherein the spectrally selective emitter is configured to operate at a temperature ranging from about 800 K to about 1500 K.

18. The method of claim 10, further comprising:
    providing a spring-loaded support coupled to a sidewall of the spectrally selective emitter, the thermally conductive substrate, and/or the solar absorber.

19. The solar thermal photovoltaic device of claim 1, wherein the optimized emitter-to-absorber planar area ratio ranges from about 1 to about 20.

20. The method of claim 10, wherein the optimized emitter-to-absorber planar area ratio ranges from about 1 to about 20.

* * * * *